United States Patent
Lin et al.

(10) Patent No.: US 6,709,767 B2
(45) Date of Patent: *Mar. 23, 2004

(54) IN-SITU OXIDIZED FILMS FOR USE AS CAP AND GAP LAYERS IN A SPIN-VALVE SENSOR AND METHODS OF MANUFACTURE

(75) Inventors: Tsann Lin, Saratoga, CA (US); Daniele Mauri, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 122 days.

This patent is subject to a terminal disclaimer.

(21) Appl. No.: 09/919,280

(22) Filed: Jul. 31, 2001

(65) Prior Publication Data

US 2003/0030944 A1 Feb. 13, 2003

(51) Int. Cl.[7] .................. G11B 5/127; C23C 14/00; C23C 8/10
(52) U.S. Cl. .................. 428/611; 428/629; 428/632; 428/637; 428/675; 428/676; 428/678; 428/215; 428/336; 428/692; 428/702; 427/539; 427/294; 427/419.3; 204/192.2; 360/324.1; 360/119; 360/120; 360/121; 148/277
(58) Field of Search .................. 428/611, 621, 428/623, 629, 632, 633, 637, 668, 669, 675, 676, 678, 679, 215, 336, 692, 702; 360/324.1, 324.11, 324.12, 324.2, 119, 120, 121; 427/539, 294, 419.3; 204/192.2; 148/277

(56) References Cited

U.S. PATENT DOCUMENTS

| 4,825,325 A | 4/1989 | Howard ............... 360/113 |
| 5,014,147 A | 5/1991 | Parkin et al. ......... 360/113 |
| 5,432,734 A | 7/1995 | Kawano et al. ....... 365/158 |
| 5,452,163 A | 9/1995 | Coffey et al. ......... 360/113 |

(List continued on next page.)

FOREIGN PATENT DOCUMENTS

| DE | 19652536 | 6/1997 | .......... H01L/43/08 |
| DE | 19720197 | 11/1998 | .......... H01L/43/08 |
| EP | 845820 | 6/1998 | .......... H01L/43/08 |

OTHER PUBLICATIONS

"Align Write Head Throat to Read Head Stripe by Plasma Etching Endpoint", IBM Research Disclosure, Dec. 1998/ 1696, 416123.

*Primary Examiner*—Paul Thibodeau
*Assistant Examiner*—Kevin M. Bernatz
(74) *Attorney, Agent, or Firm*—Kunzler & Associates

(57) ABSTRACT

Disclosed is a spin-valve sensor employing one or more in-situ oxidized films as cap and/or gap layers in order to achieve an increased GMR coefficient and improved thermal stability. A fabrication method comprises depositing multi-layer metallic films on a wafer in ion-beam and DC-magnetron sputtering modules of a sputtering system, and then transferring the wafer in a vacuum to an oxidation module where in-situ oxidation is conducted. When the method is used to form a cap layer, the cap layer may only be partially oxidized. A magnetic-field annealing may be subsequently conducted without the substantial occurrence of interface mixing and oxygen diffusion during the anneal process. The resulting spin-valve sensor exhibits an increased GMR coefficient, possibly due to induced specular scattering of conduction electrons and improved thermal stability mainly due to the protection of an underlying sensing layer from interface mixing and oxygen diffusion during the annealing process. Gap layers may also be formed from multi-layer in-situ deposition and oxidation of metal films. Smaller, more sensitive spin-valve sensors may be fabricated through the use of the alternative deposition and in-situ oxidization of the metallic films, thus allowing for greater recording data densities in disk drive systems.

33 Claims, 7 Drawing Sheets

U.S. PATENT DOCUMENTS

| | | | |
|---|---|---|---|
| 5,920,446 A | 7/1999 | Gill | 360/113 |
| 5,998,016 A | 12/1999 | Sasaki et al. | 428/336 |
| 6,063,244 A | 5/2000 | Pinarbasi | 204/192.11 |
| 6,198,608 B1 * | 3/2001 | Hong et al. | 360/320 |
| 6,329,087 B1 * | 12/2001 | Okamoto | 428/692 |
| 6,452,757 B1 * | 9/2002 | Yang et al. | 360/317 |
| 2001/0013997 A1 * | 8/2001 | Sasaki et al. | 360/317 |
| 2001/0014412 A1 * | 8/2001 | Jongill et al. | 428/692 |
| 2002/0024780 A1 * | 2/2002 | Mao et al. | 360/324.11 |
| 2002/0054463 A1 * | 5/2002 | Mukoyama et al. | 360/324.11 |
| 2002/0081457 A1 * | 6/2002 | Shimizu et al. | 428/692 |

* cited by examiner

IN-SITU OXIDIZED FILMS FOR USE AS CAP AND GAP LAYERS IN A SPIN-VALVE SENSOR AND METHODS OF MANUFACTURE

BACKGROUND OF THE INVENTION

1. The Field of the Invention

The present invention relates to spin-valve sensors for reading information signals from a magnetic medium and more particularly to novel structures for spin-valve sensors and magnetic recording systems which incorporate such sensors.

2. The Relevant Art

Computer systems generally utilize auxiliary memory storage devices having media on which data can be written and from which data can be read for later use. A direct access storage device, such as a disk drive, incorporating rotating magnetic disks is commonly used for storing data in magnetic form on the disk surfaces. Data are recorded on concentric, radially spaced tracks on the disk surfaces. Magnetic recording heads carrying read sensors are then used to read data from the tracks on the disk surfaces.

In high capacity disk drives, a giant magnetoresistance (GMR) head carrying a spin-valve sensor is now extensively used to read data from the tracks on the disk surfaces. This spin-valve sensor typically comprises two ferromagnetic films separated by an electrically conducting nonmagnetic film. The resistance of this spin-valve sensor varies as a function of the spin-dependent transmission of conduction electrons between the two ferromagnetic films and the accompanying spin-dependent scattering which takes place at interfaces of the ferromagnetic and nonmagnetic films.

In the spin-valve sensor, one of the ferromagnetic films, referred to as a pinned layer, typically has its magnetization pinned by exchange coupling with an antiferromagnetic film, referred to as a pinning layer.

The magnetization of the other ferromagnetic film, referred to as a "sensing" or "free" layer is not fixed, however, and is free to rotate in response to the field from the recorded magnetic medium (the signal field). In the spin-valve sensors, the GMR effect varies as the cosine of the angle between the magnetization of the pinned layer and the magnetization of the sensing layer. Recorded data can be read from a magnetic medium because the external magnetic field from the recorded magnetic medium causes a change in the direction of magnetization in the sensing layer, which in turn causes a change in the resistance of the spin-valve sensor and a corresponding change in the sensed voltage.

FIG. 1 shows a typical prior art spin-valve sensor 100 comprising a pair of end regions 103 and 105 separated by a central region 102. The central region 102 is formed by depositing various layers onto a bottom gap layer 118, which is previously deposited on a bottom shield layer 120, which is, in turn, deposited on a substrate. Two end regions 103, 105 abut the edges of the central region 102. A ferromagnetic sensing layer 106 is separated from a ferromagnetic pinned layer 108 by an electrically conducting nonmagnetic spacer layer 110. The magnetization of the pinned layer 108 is fixed through exchange coupling with an antiferromagnetic pinning layer 114. This spin-valve sensor is sputtered onto seed layers 116, on which the pinning, pinned, spacer and sensing layers of the spin-valve sensor grow with preferred crystalline textures during sputtering so that desired improved GMR properties are attained.

The end regions 103 and 105 are also formed by a suitable deposition method such as sputtering of various layers onto the bottom gap layer 118. Longitudinal bias (LB) and conducting lead layers 126 abut the spin-valve sensor. The central and end regions are sandwiched between electrically insulating nonmagnetic films, one referred as a bottom gap layer 118 and the other referred as a top gap layer 124.

The disk drive industry has been engaged in an ongoing effort to increase the recording density of hard disk drives, and correspondingly to increase the overall signal sensitivity to permit the GMR head of the hard disk drives to read smaller changes in magnetic flux. The major property relevant to the signal sensitivity of a spin-valve sensor is its GMR coefficient. A higher GMR coefficients leads to higher signal sensitivity and enables the storage of more bits of information on a disk surface of a given size. The GMR coefficient of the spin-valve sensor is expressed as $\Delta R_G/R_{II}$ where $R_{II}$ is a resistance measured when magnetizations of the free and pinned layers are parallel to each other, and ARG is the maximum giant magnetoresistance (GMR) measured when magnetizations of the free and pinned layers are antiparallel to each other.

Other properties relevant to the signal sensitivity of the spin-valve sensor include exchange coupling between the antiferromagnetic pinning and ferromagnetic pinned layers. This exchange coupling must be high in order to keep the magnetization of the pinned layer at a direction perpendicular to an air bearing surface for optimal sensor operation. An inadequate exchange coupling may cause canting of the magnetization of the pinned layer from the preferred direction, thereby reducing the signal sensitivity of the spin-valve sensor.

It is also vital that the sensing current flowing in the spin-valve sensor be confined to the pinned 108, spacer 110 and sensing 106 layers of the spin-valve sensor. If the sensing current is permitted to shunt through the pinning 114 or other layers, the resistance of the spin-valve sensor will be low, thus producing a low GMR coefficient. Accordingly, the material selected for the pinning layer must possess a high electrical resistivity in order to prevent the current shunting.

In certain spin-valve sensors, particularly those with a Ni-Fe sensing layer, a cap layer 112 is often formed over the sensing layer. The cap layer 112 serves several purposes, and plays a crucial role in attaining a high GMR coefficient. For instance, a Cu cap layers is thought to induce spin filtering, while a NiO cap layer is thought to induce specular scattering. Both spin filtering and specular scattering are believed to increase the GMR coefficient of a spin-valve sensor. In addition, a cap layer may be employed to prevent the underlying sensing layer from interface mixing occurring immediately during depositions and oxygen diffusion occurring during subsequent annealing, thereby maintaining suitably soft magnetic properties of the sensing layer and improving the thermal stability of the spin-valve sensor. The term "soft magnetic property" refers to the capability of a spin-valve sensor to sense very small magnetic fields.

Currently, a Ta cap layer is used in many conventional spin-valve sensors. However, the Ta cap layer does not exhibit desired specular scattering, and is considered inadequate in preventing the sensing layer from interface mixing and oxygen diffusion. Interface mixing originates from direct contact between the sensing layer and the Ta cap layers, and causes a substantial loss in the magnetic moment of the sensing layer. For one currently used spin-valve sensor with a 0.32 memu/cm$^2$ sensing layer, this magnetic moment loss accounts for 25% of the magnetic moment of the sensing layer. Oxygen diffusion originates from low passivity of the Ta cap layer, which oxidizes continuously and entirely during annealing, such that oxygen eventually penetrates into the sensing layer, causing more losses in the magnetic moment of the sensing layer.

Thus, it can be seen from the above discussion that there is a need existing in the art for an improved spin-valve sensor with an increased GMR coefficient and improved thermal stability. Particularly, it would be advantageous to provide a spin-valve sensor with a suitable cap layer to achieve the increased GMR coefficient and improved thermal stability through decreases in the occurrence of interface mixing and oxygen diffusion.

OBJECTS AND BRIEF SUMMARY OF THE INVENTION

The apparatus of the present invention has been developed in response to the present state of the art, and in particular, in response to the problems and needs in the art that have not yet been fully solved by currently available spin-valve sensors. Accordingly, it is an overall object of the present invention to provide an improved spin-valve sensor that overcomes many or all of the above-discussed shortcomings in the art.

To achieve the foregoing object, and in accordance with the invention as embodied and broadly described herein in the preferred embodiments, an improved spin-valve sensor is provided and configured with a cap layer formed by deposition and in-situ oxidation in a controlled environment. Top and bottom gap layers may also be formed using the deposition/in-situ oxidation method of the present invention. A method of the present invention is also presented for forming an in-situ oxidized metal film on a spin-valve sensor with a deposition/in-situ oxidation process.

The spin-valve sensor of the present invention is preferably incorporated within a disk drive system configured substantially in the manner described above. In addition, the spin-valve sensor of the present invention preferably comprises a cap layer formed of an in-situ oxidized metal film. In one embodiment, the film is Al, Hf, Si, Y, or Zr. In alternate embodiments of the invention, a noble metallic film, e.g., Au, Cu, Rh, or Ru may be sandwiched between the sensing layer and the in-situ oxidized cap layer.

The spin-valve sensor preferably comprises one or more seed layers, a pinning layer, a pinned layer, a spacer layer, a sensing layer, and a cap layer, as discussed above. Nevertheless, the in-situ oxidized cap layer of the present invention is intended for use with any type of spin-valve sensor having a suitable construction.

In one embodiment, a bottom shield layer preferably formed of a Ni-Fe film and a bottom gap layer preferably formed of an $Al_2O_3$ film are deposited on a wafer. Multiple seed layers preferably formed of $Al_2O_3$, Ni-Cr-Fe and Ni-Fe films are deposited on the bottom gap layer. A pinning layer preferably formed of a Pt-Mn film is then deposited on the multiple seed layers. Pinned layers preferably formed of Co-Fe, Ru and Co-Fe films are then deposited on the pinning layer. A spacer layer preferably formed of an oxygen-doped, in-situ oxidized Cu-O film is then deposited on the pinned layer. Sensing layers preferably formed of Co-Fe and Ni-Fe films are then deposited on the spacer layer. A cap layer preferably formed of an in-situ oxidized Al film (Al-O) is then formed on the sensing layer with a deposition/in-situ oxidization process. Partial in-situ oxidization is preferred for attaining a high GMR coefficient.

In an alternative embodiment, top and bottom gap layers preferably formed of multilayer in-situ oxidized Al films are formed on the wafer. The deposition/in-situ oxidation process is repeated until selected thicknesses of the top and bottom gap layers are attained. Full in-situ oxidization of the top and bottom gap layers is preferred for attaining high breakdown voltages.

The deposition/in-situ oxidation process preferably comprises depositing a metal film in a deposition chamber in a vacuum without the presence of oxygen, and then conducting the in-situ oxidization for a wide range of time in a wide range of oxygen pressures in an oxidation chamber. The wafer is then transferred to a second chamber where the metal is naturally oxidized. In one embodiment given by way of example, the in-situ oxidization is conducted for a period of about 8 minutes in about 0.5 Torr of oxygen. The exposure to oxygen is preferably conducted with a moderate temperature, such as ambient room temperature.

The top and bottom gap layer may likewise be deposited using the deposition/in-situ oxidation process of the present invention. In order to achieve greater thicknesses of these layers, multiple layers may be alternatively deposited and oxidized using the deposition/in-situ oxidation process. Preferably, when forming the seed and gap layers, the alternating oxidized layers are fully oxidized.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 2:
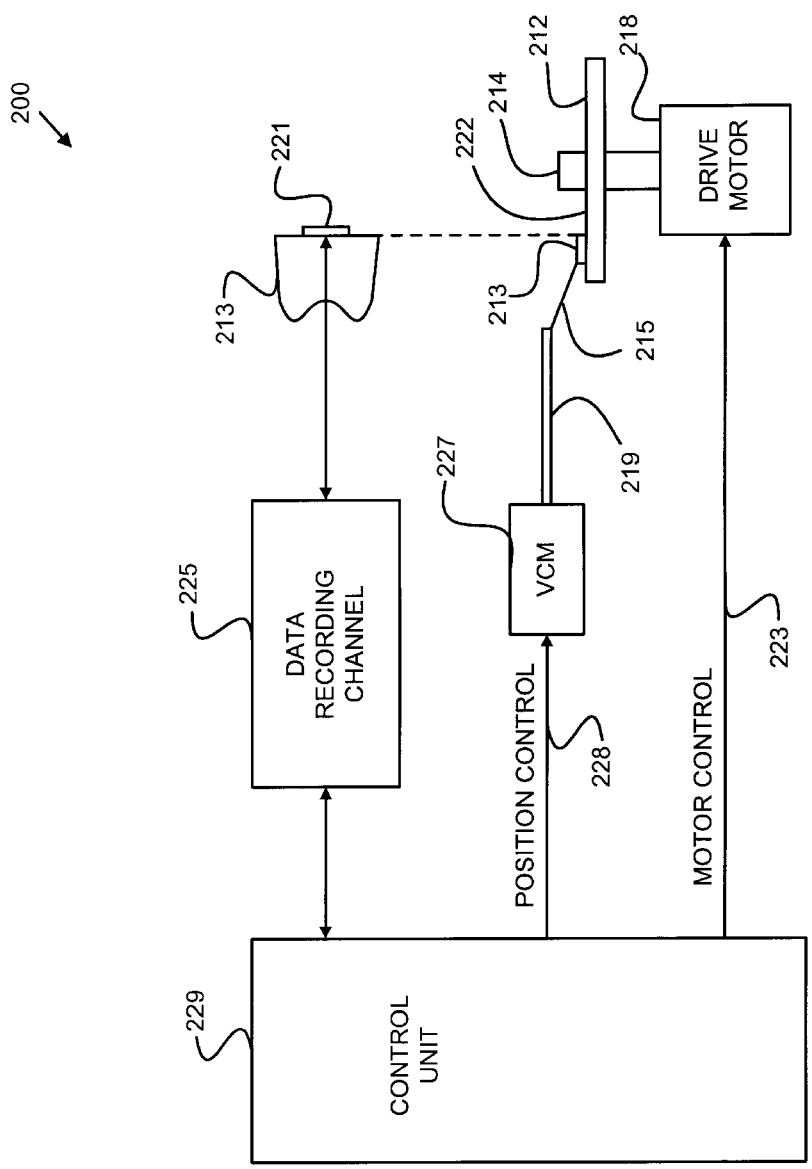
FIG. 2 is a schematic block diagram illustrating a magnetic recording disk drive system.

FIG. 2 schematically depicts one example of a disk drive 200 suitable for incorporating a spin-valve sensor of the present invention. As shown in FIG. 2, the disk drive 200 comprises at least one rotatable magnetic disk 212 supported on a spindle 214 and rotated by a disk drive motor 218. The magnetic recording media on each magnetic disk 212 is in the form of concentric, annular data tracks (not shown).

At least one slider 213 is positioned on the magnetic disk 212. Each slider 213 supports one or more magnetic read/write heads 221 incorporating the spin-valve sensor of the present invention. As the magnetic disk 212 rotates, the slider 213 moves back and forth across the disk surface 222 so that the heads 221 may access different portions of the magnetic disk 212 where desired data are recorded. Each slider 213 is attached to an actuator arm 219 by means of a suspension 215. The suspension 215 provides a slight spring force which biases the slider 213 against the magnetic disk surface 222. Each actuator arm 219 is attached to an actuator 227.

The actuator 227 as shown in FIG. 2 may be a voice coil motor (VCM). The VCM comprises a coil movable within a fixed magnetic field, and the direction and speed of the coil movements are controlled by the motor current signals supplied by a controller 229.

During operation of the disk storage system, the rotation of the magnetic disk 212 generates an air bearing between the slider 213 and the disk surface 222 which exerts an upward force or lift on the slider 213. The air bearing thus counter-balances the slight spring force of the suspension 215 and supports the slider 213 off and slightly above the disk Surface by a small, substantially constant spacing during normal operation. The surface of the slider 213, which includes the head 221 and faces the surface of disk 212, is referred to as an air bearing surface (ABS).

The various components of the disk storage system are controlled in operation by control signals generated by the control unit 229. The control signals include access control signals and internal clock signals. Typically, the control unit 229 comprises logic control circuits, storage means, and a microprocessor. The control unit 229 generates control signals to control various system operations such as drive motor control signals on a line 223 and head position and seek control signals on a line 228. The control signals on the line 228 provide the desired current profiles to optimally move and position the slider 213 to the desired data track on the magnetic disk 212. Read and write signals are communicated to and from the read/write heads 221 by means of a recording channel 225. In the depicted embodiment, the read/write heads 221 incorporate a spin-valve sensor of the present invention.

Figure 3:
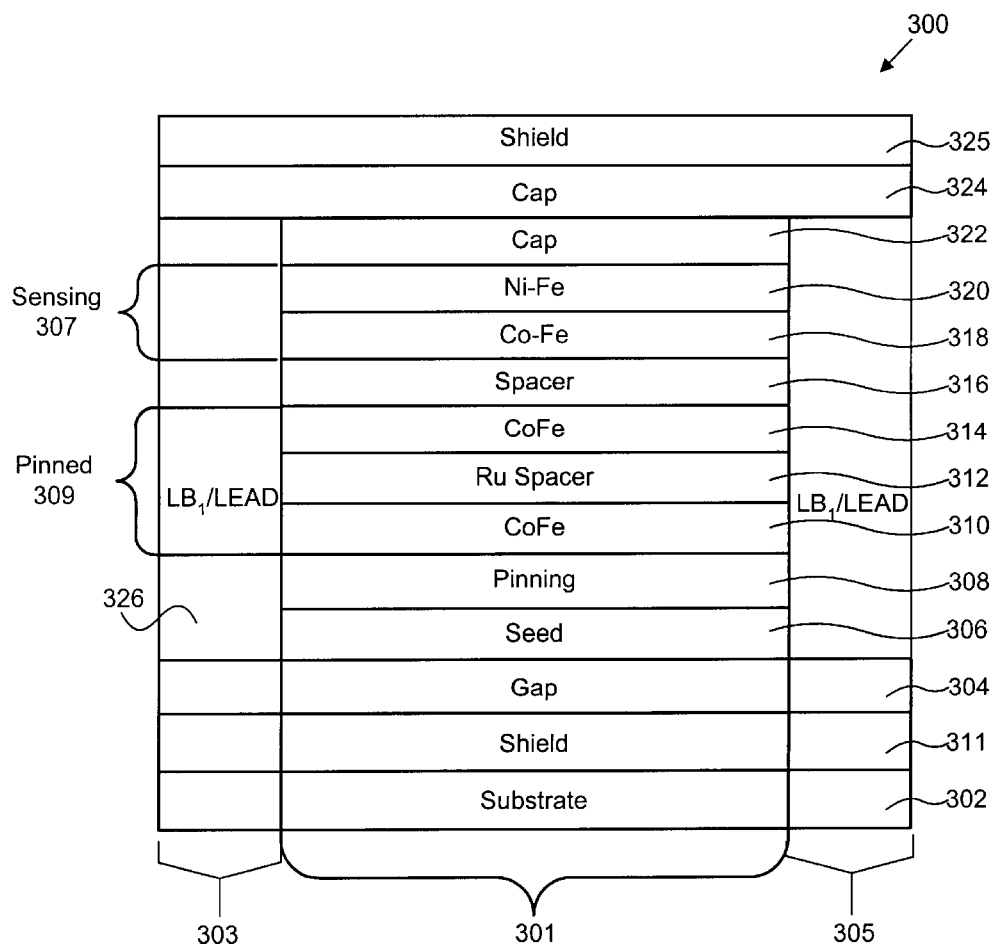
FIG. 3 is a cross-sectional view illustrating the structure of a spin-valve sensor in accordance with one embodiment of the present invention.

Referring now to FIG. 3, shown therein is one embodiment of a spin-valve sensor 300 employing the in-situ oxidized films of the present invention. The depicted embodiment is a bottom-type synthetic spin-valve sensor, but of course, other types of spin-valve sensors may also be formed using the novel in-situ process of the present invention. The depicted spin-valve sensor 300 comprises a pair of end regions 303, 305 separated by a central region 301. The central region 301 is formed by a suitable method such as sputtering a read gap layer 304. The end regions 303, 305 abut the central region 301.

In accordance with one embodiment of a spin-valve, ferromagnetic sensing layers 307 (often collectively referred to as "free layers") are shown separated from ferromagnetic pinned layers 309 by a spacer layer 316. In one embodiment, the spacer layer 316 is a non-magnetic 22 Å thick, electrically-conducting oxygen-doped, in-situ oxidized Cu (Cu-O) film. Under one embodiment of the present invention, the sensing layers 307 comprise a 9 Å thick Co-Fe film 318 and an adjacent 27 Å thick Ni-Fe film 320. The pinned layer 309 comprises an 18 Å thick Co-Fe film 310, an 8 Å thick Ru film 312, and a 22 Å thick Co-Fe film 314. The magnetizations of the pinned layers 309 are fixed through exchange coupling with a 200 Å thick antiferromagnetic Pt-Mn pinning layer 308.

One manner of forming the spin-valve sensor 300 of FIG. 3 will be discussed herein by way of example. In the depicted embodiment, a bottom shield layer 311, preferably formed of a 1 µm thick Ni-Fe film and a bottom gap layer 304, preferably formed of a 100 Å thick $Al_2O_3$ film, are deposited on a substrate 302 of a wafer. Seed layers 306 may then be deposited on the bottom gap layer 304.

In one embodiment, multiple seed layers 306, preferably formed of a 3 n/m thick $Al_2O_3$ film, a 30 Å thick Ni-Cr-Fe film and a 10 Å thick Ni-Fe film are deposited on the bottom gap layer 304. The 100 Å thick $Al_2O_3$ film used as the bottom gap layer 304 may be sputtered in an argon gas from an $Al_2O_3$ target, while the 30 Å thick $Al_2O_3$ film used as the seed layer is preferably reactively sputtered from an Al target in a mixed atmosphere of argon and oxygen. The multiple seed layers are used to provide a desirable surface with a strong face-centered-cubic (FCC) {111} crystalline texture and coarse polycrystalline grains on which the remaining layers of the spin-valve sensor may be grown epitaxially in order to attain a high GMR coefficient.

An antiferromagnetic pinning layer 308, preferably formed of a 200 Å thick Pt-Mn film, is then, under this embodiment, deposited on the seed layers 306. The pinned layers 309, preferably formed of a 20 Å thick Co-Fe film, an 8 Å thick Ru film, and a 22 Å thick Co-Fe film, are then deposited on the pinning layer 308. A spacer layer 316, preferably formed of an oxygen-doped and in-situ oxidized 22 Å thick Cu (Cu-O) film, is then deposited on the pinned layer 309. Sensing layers 307 are then formed, preferably of a 9 Å thick Co-Fe film and a 27 Å thick Ni-Fe film, on the spacer layer 316. A cap layer 322, preferably formed of an in-situ oxidized Al film (Al-O), is then formed on the sensing layers 307. The cap layer 322 is preferably formed with the in-situ deposition/oxidization process of the present invention, one example of which is discussed below with respect to FIG. 7.

The cap layer 322 may be formed of any suitable in-situ oxidized material, examples of which include in-situ oxidized Al, Hf, Si, Y, and Zr films. An in-situ oxidized Al film is considered to be particularly effective, due to its amorphous state which is thought to promote high specular scattering.

In addition, a metal film may be disposed between the sensing layer 307 and the cap layer 322. In one embodiment, the metal film comprises Cu with a thickness in a range of between about 6 Å and about 12 Å. More preferably, the Cu film has a thickness in the range of between about 8 Å and about 10 Å.

A top gap layer 324 is then preferably formed on the cap layer 322. In one embodiment, the top gap layer 434 is a 100 Å thick $Al_2O_3$ film. A top shield layer 325 may then be formed on top of the gap layer 324. In one embodiment, the top shield layer 325 is formed of a 1 µm thick Ni-Fe film.

Figure 1:
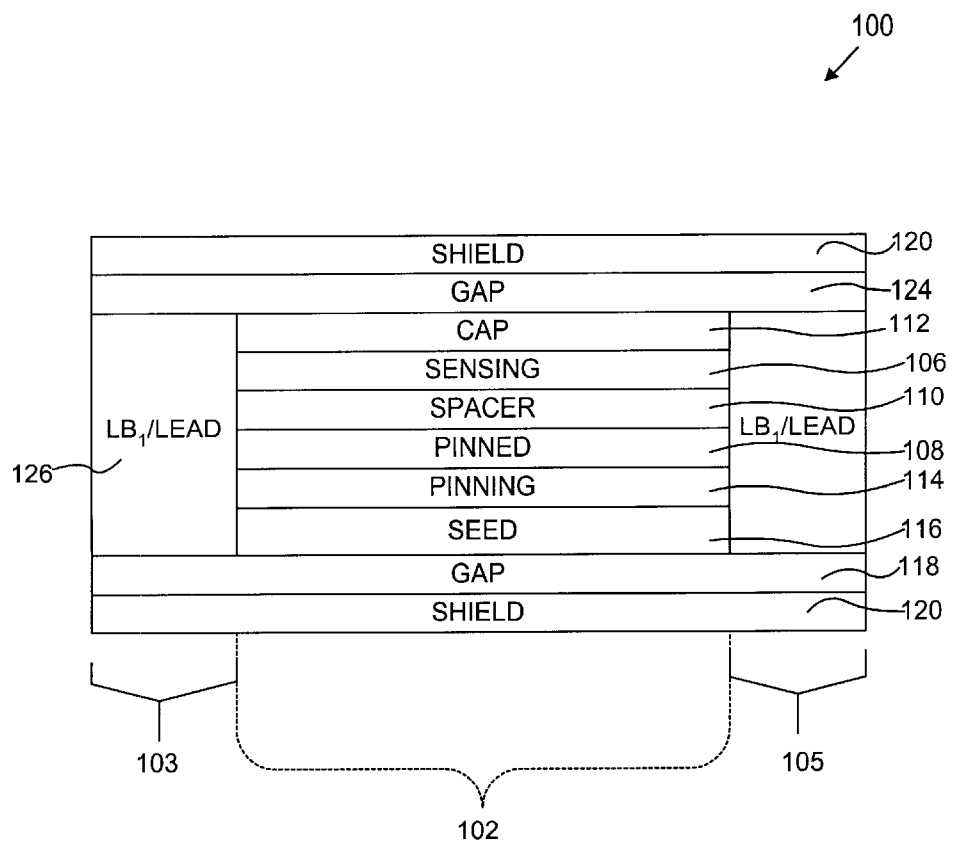
FIG. 1 is a cross-sectional view illustrating the structure of a spin-valve sensor of the prior art.

The low-passivity Ta film of the prior art cap layer (112 of FIG. 1) oxidizes continuously and entirely. In contrast, using the deposition/in-situ oxidation process of the present invention, a high-passivity film is oxidized only at its surface, resulting in a natural oxide cap layer which is dense and highly protective against oxygen diffusion into the sensing layer.

The cap layer film of the present invention is preferably only partially oxidized, with the upper portion of the film oxidized, while the lower portion of the film directly adjacent the sensing layer remains intact and substantially free from oxygen. The natural dense oxide layer formed in the upper portion of the film is thought to provide higher specular scattering than a thick oxide film either sputtered from an oxide target or reactively sputtered from a metal target in a mixture of argon and oxygen gases. This high specular scattering causes a substantial increase in the GMR coefficient of the sensor.

In addition, interface mixing between the sensing and oxide layers and oxygen penetration into the sensing layer are also prevented. Furthermore, due to the metallic contact between the lower portion of the Al film and the sensing layers, the soft magnetic properties of the sensing layers are very well controlled. Thus, an annealing process subsequent to the sensing layer deposition (which is often required when using a Pt-Mn pinning layer as discussed herein) may be conducted without causing interface mixing or oxygen diffusion.

In the preferred embodiments, the in-situ oxidized film is thick enough to ensure the metallic contact with the sensing layer after the in-situ oxidization, but is also thin enough to avoid current shunting, which reduces the GMR coefficient. Hence, to form the in-situ oxidized cap layer in one example, an 8 Å thick Al film is deposited and in-situ oxidized for 8 min in 0.5 Torr oxygen. After the in-situ oxidization, an approximately 10 Å thick in-situ oxidized film is formed. The in-situ oxidized film when used as a cap layer is preferably only partially oxidized, as discussed below with respect to FIG. 4.

To ensure the metallic contact between the sensing and cap layers, the deposition/in-situ oxidation process may also be applied to noble metallic films with even higher passivity (e.g., Au, Cu, Rh, Ru, etc.) after the deposition of the sensing layers and before the deposition/in-situ oxidation processes applied to the Al film. To form this additional in-situ oxidized cap layer, an 8 Å thick noble metallic film is also deposited and in-situ oxidized for 8 min in 0.5 Torr oxygen. After the in-situ oxidization, an approximately 10 Å thick in-situ oxidized noble metallic film is formed.

Figure 4:
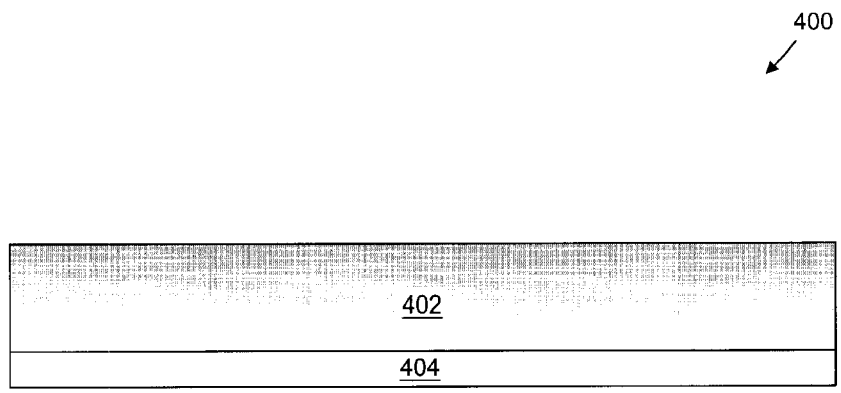
FIG. 4 is a schematic block diagram illustrating the structure of a cap layer in one embodiment of the present invention.

FIG. 4 illustrates one embodiment of a partially oxidized metal film 400 which may be formed with the deposition/in-situ oxidization process of the present invention. Within the partially oxidized metal film 400, an upper portion 402 is oxidized, while the lower portion 404 remains intact and substantially free from oxygen.

When used as a cap layer (e.g., 322 of FIG. 3), the thickness of the partially oxidized film 400 is preferably in the range of between about 5 and about 15 Å. More preferably, the thickness is in the range of between about 8 Å and about 12 Å. Most preferably, the thickness is about 10 Å. The lower portion 404 preferably has a thickness falling within a range of between about 1 Å and about 5 Å. More preferably, the thickness of the lower portion 404 falls within a range of between about 2 Å and about 4 Å. Most preferably, the thickness of the lower portion 404 is about 3 Å. The oxidized upper portion 402 preferably has a thickness falling within a range of between about 4 Å and about 10 Å. More preferably, the upper portion 402 has a thickness falling within the range of between about 5 and 9 Å. Most preferably, the upper portion 402 has a thickness of about 7 Å.

The spin-valve sensor 300 may be sandwiched between top and bottom gap layers 324, 304, which are formed of a plurality of in-situ oxidized layers, which will be explained in greater detail below with reference to FIG. 5.

Figure 5:
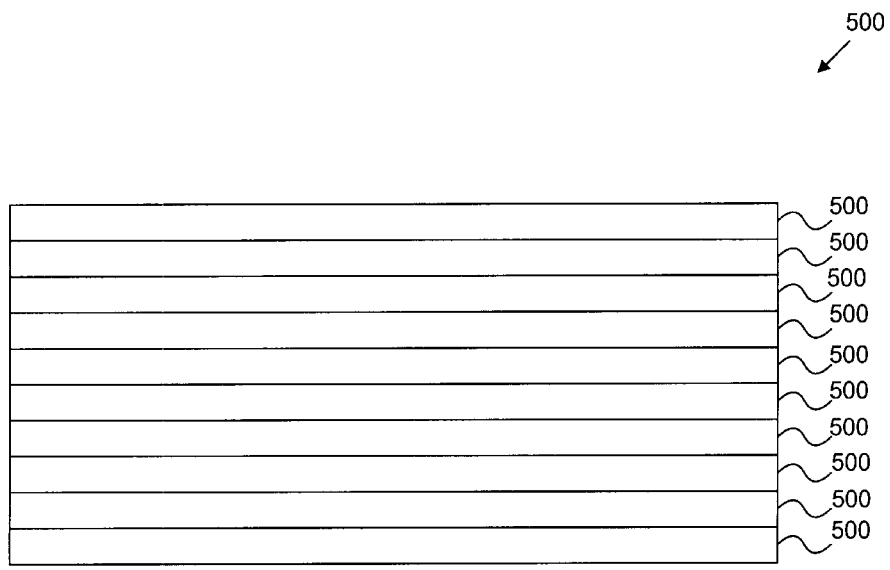
FIG. 5 is a schematic block diagram illustrating a plurality of in-situ oxidized Al films in an alternative embodiment of the present invention.

FIG. 5 illustrates an alternative embodiment in which a repeated deposition/in-situ oxidation process is used to form top and bottom gap layers 304, 324. The top and bottom gap layers 304, 324 may be formed of a plurality of in-situ oxidized metal films 510, one example of which is Al. The deposition/in-situ oxidation process is repeated until selected thicknesses of the top and bottom gap layers are attained. Each in-situ oxidized film 510 is formed in the manner described with respect to FIG. 4. However, full in-situ oxidation is preferred to prevent partial oxidation and to ensure high breakdown voltages. Hence in one example, to form each in-situ oxidized read gap layer, an Al film is deposited and in-situ oxidized for 16 min in an oxygen gas of 2 Torr. In another example, the Al film is oxidized for a longer time in the oxygen gas with a higher pressure. The process is repeated until the desired thickness is attained. In one example, each in-situ oxidized film has a thickness of about 10 Å and 10 layers are deposited. In a further example, up to 20 layers are deposited.

Figure 6:
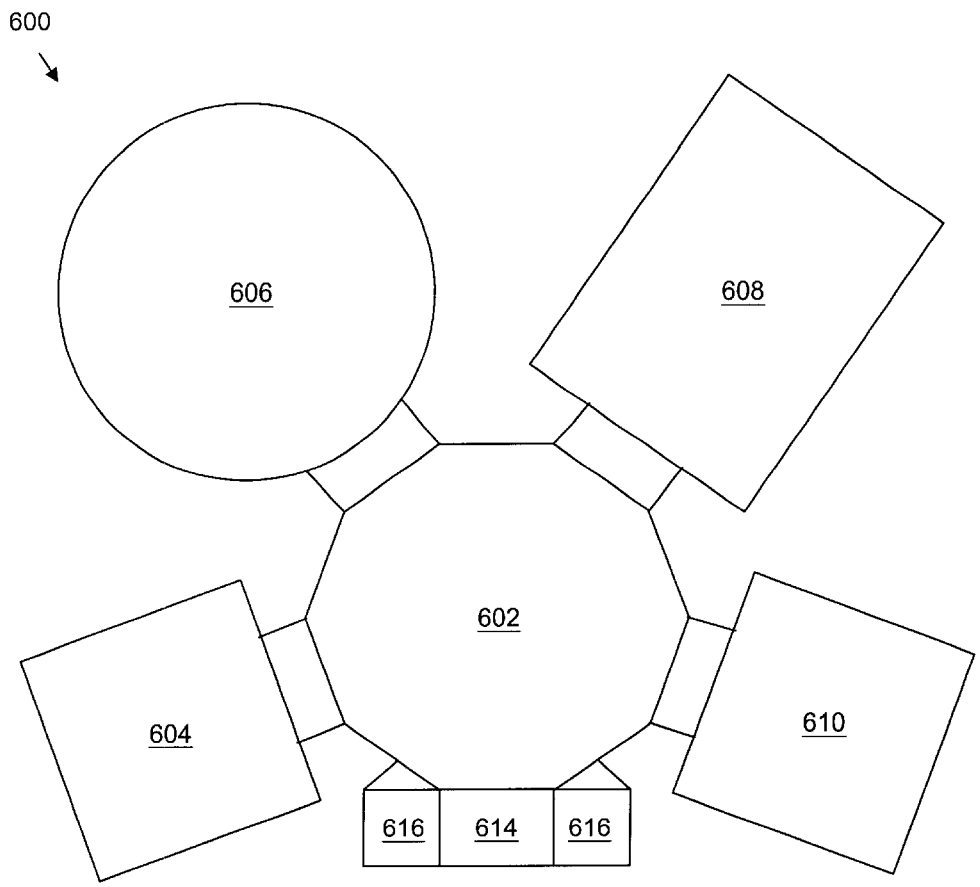
FIG. 6 is a schematic block diagram illustrating an integrated DC magnetron/ion beam sputtering system suitable for use with the present invention.

Referring now to FIG. 6, shown therein is one embodiment of an integrated DC magnetron/ion beam sputtering system 600 suitable for fabricating a spin-valve sensor and for conducting the deposition/in-situ oxidation process of the present invention. The sputtering system 600 of FIG. 6 is sold by the Veeco Corporation of Plainview, New York. The sputtering system 600 as depicted comprises a transport module 602 surrounded by a first single-target DC magnetron sputtering module 604, a multi-target DC magnetron sputtering module 606, a multi-target ion beam sputtering module 608, and a second single-target DC magnetron sputtering module 610. Loadlocks, 616 allow the ingress and egress of wafers. A control panel 614 controls the parameters and processes of the sputtering system 600.

Figure 7:
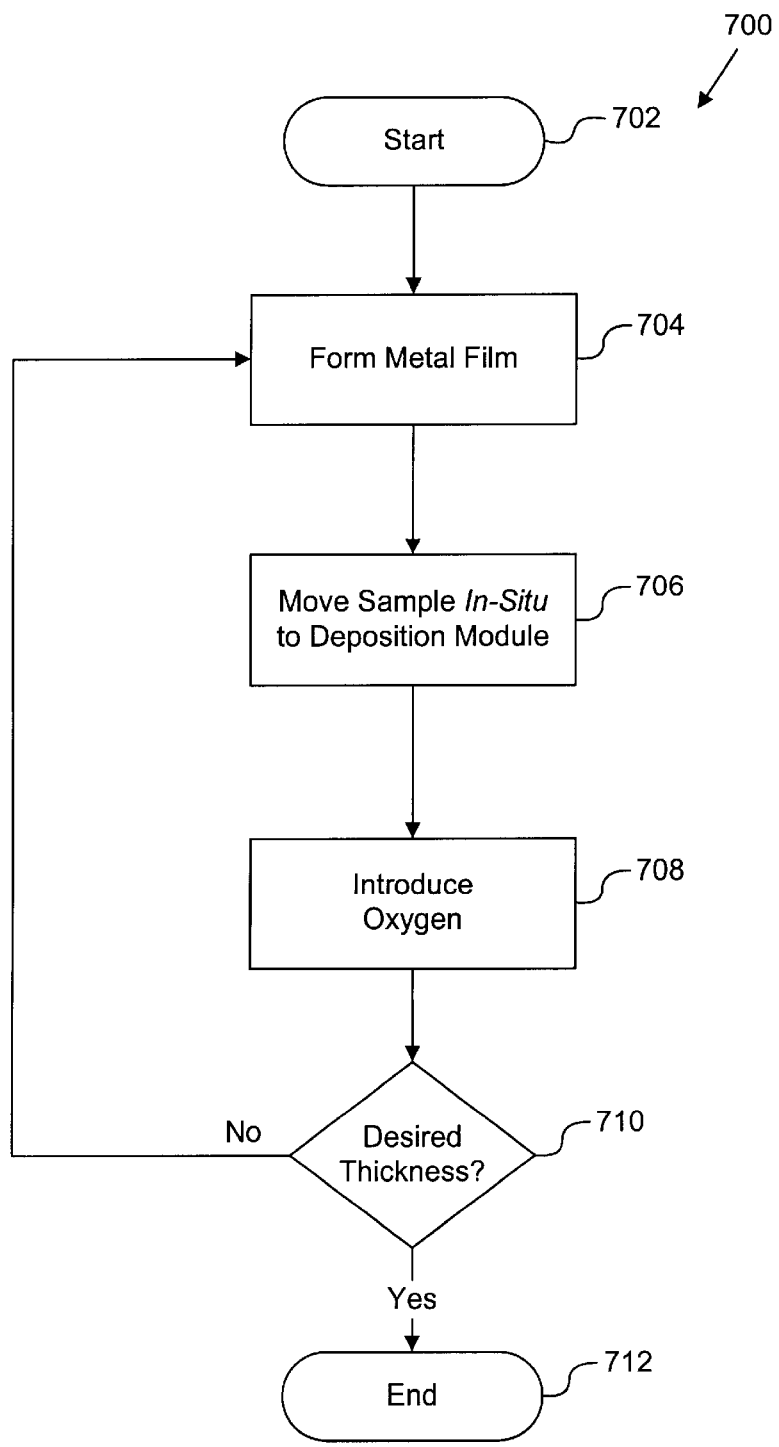
FIG. 7 is a schematic flow chart illustrating a method for deposition/in-situ oxidization of the present invention.

FIG. 7 is a schematic flow chart diagram illustrating one embodiment of a method 700 of forming in-situ oxidized films of the present invention. The method 700 starts 702 and the thin metal film is formed 704, preferably using an integrated DC-magnetron/ion beam sputtering system, such as that described with reference to FIG. 6. Under the preferred embodiment of the present invention, the sputtering of the thin metal film 504 is accomplished in an atmosphere of argon with a pressure of 3 mTorr.

Once the desired thickness of the thin metal film on the workpiece wafer has been achieved, the gas is evacuated from the sputtering chamber module 604–610. The workpiece wafer is then moved in a vacuum (e.g., through a transport module 602) to an the in-situ oxidization module, which may comprise another of the sputtering modules 604–610. The thin metal film 504 is then preferably moved 706 within the closed system in the absence of oxygen to the oxidization chamber where oxygen is introduced 708. In one embodiment, the pressure of oxygen in the module 704 is in the range of about 0.5 to about 10 Torr. To ensure full in-situ oxidation, the pressure of oxygen in the in-situ oxidation module 704 is preferably 2 Torr or greater. The temperature is preferably maintained at about room temperature (i.e., about 70° F.).

Under the embodiment of FIG. 4, partial oxidation of the thin metal film 504 is accomplished by the introduction of about 0.5 Torr of $O_2$ for a period of about 8 minutes at room temperature. The full oxidation of the embodiment of FIG. 5 is conducted for a longer period of time, in one embodiment for 16 min in an oxygen gas of 2 Torr, as discussed above. The in-situ oxidization is preferably a natural oxidization performed at ambient room temperature. When used to form laminated layers such as the embodiment of FIG. 5, the method 700 is repeated, until determining 710 that the selected number of layers or selected thickness has been reached. The method 700 then ends 712.

In one embodiment, the sputtering system 600 and in-situ deposition method 700 are used in the fabrication of a spin-valve sensor with cap and gap layers all formed of in-situ oxidized Al films. In this embodiment, the read gap thickness is designed to be as small as 600 Å for magnetic recording at ultrahigh densities ($\geq$30 Gb/in$^2$). To attain this read gap thickness, the spin-valve sensor is sandwiched between 100 Å thick $Al_2O_3$ top and bottom gap layers.

The bottom gap layers formed of 10 layers of in-situ oxidized Al films are formed on a substrate of a wafer in the first single-target DC magnetron sputtering module 604. The deposition/in-situ oxidation process is repeated 10 times until a 100 Å thick bottom gap layer is attained. To ensure a full in-situ oxidization that is preferred for attaining high breakdown voltages, the deposition of an Al film with DC magnetron sputtering from a pure Al target in an argon gas of 3 mTorr and subsequent in-situ oxidation for 16 minutes in an oxygen gas of 2 Torr are conducted alternatively for a total of 10 times.

The wafer is then transferred to the second single-target DC magnetron sputtering module 610 for the deposition of the first seed layer that is in one embodiment formed of a 30 Å thick $Al_2O_3$ film. The $Al_2O_3$ film is then deposited, preferably with reactive pulsed-DC magnetron sputtering from a pure Al target in mixed argon and oxygen gases of 2.25 and 0.75 mTorr, respectively. This $Al_2O_3$ film when used as a seed layer in disclosed embodiments plays a significant role in increasing the {111} crystalline textures of subsequently deposited films and in improving the GMR coefficient of the spin-valve sensor. In contrast, an Al-O film, formed with the deposition/in situ oxidation process, has been found to be a non-suitable seed layer.

The wafer is then transferred to the multi-target ion beam sputtering module 608 for the deposition of the second and third seed layers that may be formed of a 30 Å thick Ni-Fe-Cr film and a 10 Å thick Ni-Fe film, respectively. The Ni-Cr-Fe and Ni-Fe films are preferably deposited in a xenon gas of 0.12 mTorr.

The wafer is then transferred to the multi-target DC magnetron sputtering module 606 for the deposition of the remaining layers of the spin-valve sensor, in one embodiment including a 200 Å thick Pt-Mn film, a 20 Å thick Co-Fe film, an 8 Å thick Ru film, a 22 Å thick Co-Fe film, an oxygen-doped/in-situ oxidized 22 Å thick Cu (Cu-O) film, a 9 Å thick Co-Fe film, a 27 Å thick Ni-Fe film, and a 10 Å thick in-situ oxidized Al (Al-O) film. All the metallic films except the Cu-O film are deposited in an argon gas of 3 mTorr and in a magnetic field of 40 Oe parallel to an alignment mark. To form the Cu-O film, a Cu film is deposited in mixed argon and oxygen gases of 2.985 and 0.015 mTorr, respectively, and then in-situ oxidized in mixed argon and oxygen gases of 2.94 and 0.06 mTorr for 4 minutes, respectively. To form the Al-O film, an Al film is deposited in an argon gas of 3 mTorr and then in-situ oxidized in an oxygen gas of 0.5 Torr for 8 minutes.

In addition, to form an additional Cu-O or Ru-O film before the formation of the Al-O film, a Cu or Ru film is deposited in an argon gas of 3 mTorr and then in-situ oxidized in an oxygen gas of 0.5 Torr for 8 minutes.

After the depositions, the wafer is annealed for 300 minutes at 265° C. in a magnetic field of 10 kOe perpendicular to an alignment mark. After annealing, a 30 Å thick Ta film is deposited for the use as an adhesion layer for photoresist layers applied in the subsequent patterning process. In this patterning process, bilayer photoresists are applied and exposed in a photolithographic tool to mask the spin-valve sensor in a central region, and then developed in a solvent to form an undercut. The spin-valve sensor in unmasked side regions is removed by ion milling until the $Al_2O_3$ bottom read gap layer is exposed, and longitudinal bias (LB) and first leads ($LD_1$) layers are immediately deposited.

Subsequently, the bilayer photoresists are lifted off and a similar patterning process continues for the deposition of second lead ($LD_2$) layers. Ion milling or reactive ion etching is applied to remove the 30 Å thick Ta film. The top gap layers formed of 10 layers of in-situ oxidized Al films are then formed on the wafer in the first single-target DC magnetron sputtering module 604. The deposition/in-situ oxidation process is repeated 10 times until about 100 Å thick top gap layers are attained. To ensure full in-situ oxidization preferred for attaining high breakdown voltages, the deposition of an Al film with DC magnetron sputtering from a pure Al target in an argon gas of 3 mTorr and its in-situ oxidation in an oxygen gas of 2 Torr for 16 minutes are conducted alternatively for 10 times.

The spin-valve sensors fabricated as described in this invention have been found to exhibit much better magnetic properties than a conventional spin-valve sensor with a Ta seed layer and a Ta cap layer.

Table 1 lists magnetic and magnetoresistive properties of spin-valve sensors used in the prior art and in this invention.

TABLE 1

| Seed Layer<br>Cap Layer | Ta<br>Ta | $Al_2O_3$/<br>Ni—Cr—Fe/<br>Ni—Fe<br>Al—O | $Al_2O_3$/<br>Ni—Cr—Fe/<br>Ni—Fe<br>Cu—O/Al—O | $Al_2O_3$/<br>Ni—Cr—Fe/<br>Ni—Fe<br>Ru—O/Al—O |
|---|---|---|---|---|
| $m_1$ (memu/cm$^2$) | 0.28 | 0.32 | 0.32 | 0.32 |
| $\lambda_S$ (x10$^{-6}$) | -0.3 | +0.15 | -1.2 | -1.58 |
| $H_C$ (Oe) | 14.3 | 6.2 | 6.2 | 6.2 |
| $H_F$ (Oe) | -25.3 | -6.6 | -12.1 | -12.5 |
| $R_{//}$ ($\Omega$/□—) | 20.2 | 16.6 | 15.6 | 16.4 |
| $\Delta R_G/R_{//}$ (%) | 7.7 | 13.8 | 13.4 | 13.4 |
| $\Delta R_G$ ($\Omega$/□—) | 1.56 | 2.29 | 2.09 | 2.20 |

The replacement of the Ta cap layer with the in-situ oxidized cap layer causes an increase in the areal magnetic moment of the sensing layer ($m_1$) from 0.28 to 0.32 memu/cm$^2$, a decrease in the amplitude of the ferromagnetic coupling field ($|H_F|$) from 25.3 to 6.6 Oe, nd a decrease in the easy-axis coercivity ($H_c$) from 14.3 to 6.2 Oe. These changes in magnetic properties may originate from minimized interface mixing at the interface between the sensing and in-situ oxidized cap layers. The replacements of the Ta seed and Ta cap layers with the $Al_2O_3$/Ni-Cr-Fe/Ni-Fe seed and Al-O cap layers, respectively, causes a decrease in the sheet resistance of the spin-valve sensor ($R_{//}$) from 20.2 to 16.6 $\Omega$/▱ but an increase in the GMR coefficient ($\Delta R_G/R_{//}$) from 7.7 to 13.8%. These changes in magnetoresistive properties may originate from grain coarsening in the spin-valve sensor due to recrystalization in the Ni-Cr-Fe/Ni-Fe films, and improved specular scattering at the interface between the sensing and in-situ oxidized cap layers.

In addition, the sandwiching of the Cu-O or Ru-O cap layer between the sensing and Al-O cap layers causes a slight decrease in $\Delta R_G/R_H$, and a transition in the saturation magnetostriction of the sensing layer ($\lambda m_S$) from positive to negative values. This transition may originate from improved metallic contact between the sensing and cap layers. This negative $\lambda_S$ is preferred and is typically controlled in the range from $-2 \times 10^{-6}$ to $-1 \times 10^{-6}$ for improving magnetic and thermal stability of the spin-valve sensor. Hence, in spite of the fact that the use of the Cu-O or Ru-O cap layer causes the slight decrease in $\Delta R_G/R_H$, it may nevertheless be employed for improving magnetic and thermal stability of the spin-valve sensor.

The in-situ oxidation process of the present invention may also be applied to other types of spin-valve sensors, one example of which includes, a magnetic-tunnel-junction sensor which is well known in the art and which shares a similar structure to the spin-valve sensors discussed by way of example herein.

Figure 8:
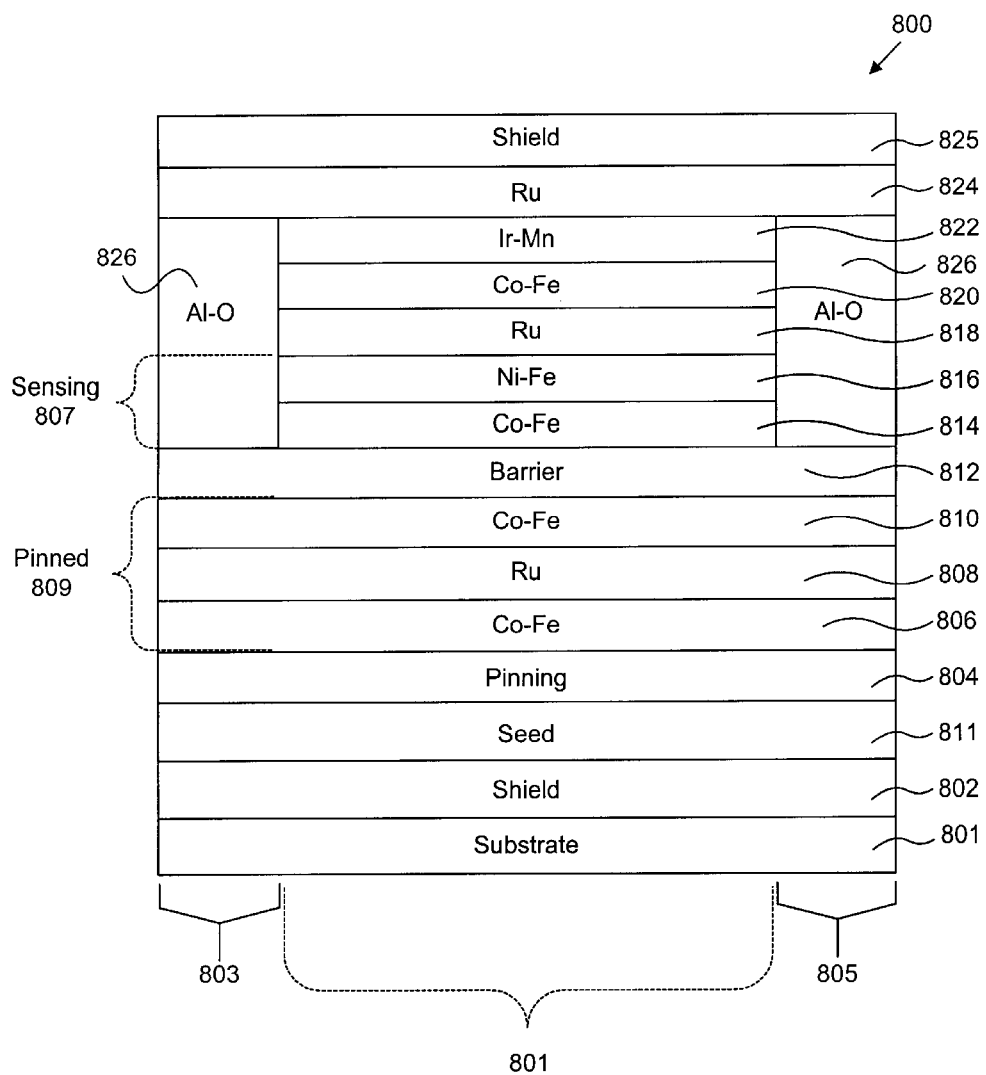
FIG. 8 is a cross-sectional view illustrating the structure of one embodiment of a magnetic-tunnel-junction sensor formed in accordance with the present invention.
Figure 3:
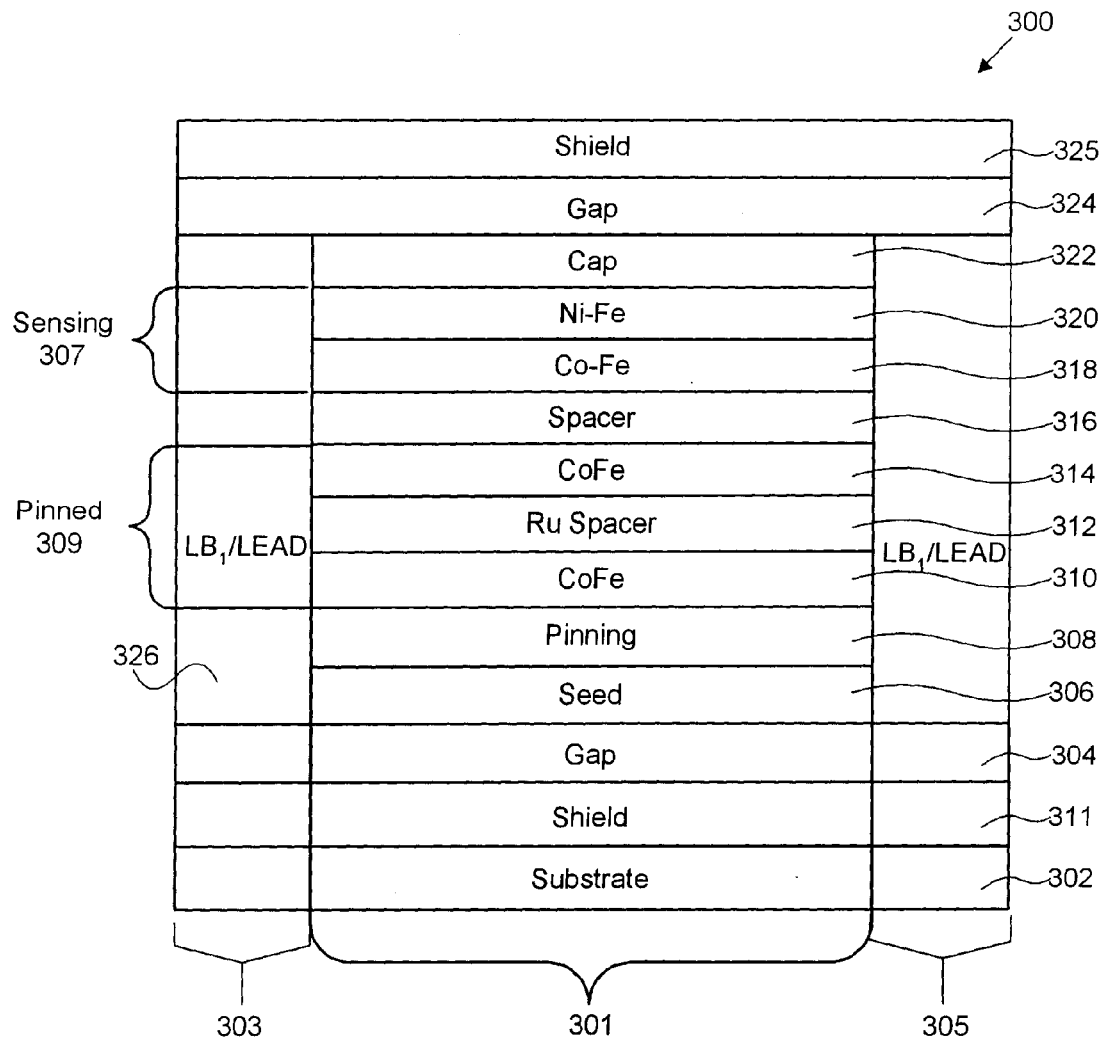
Figure 4:
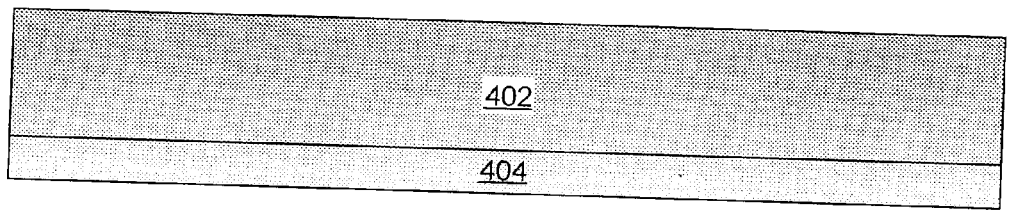
Figure 5:
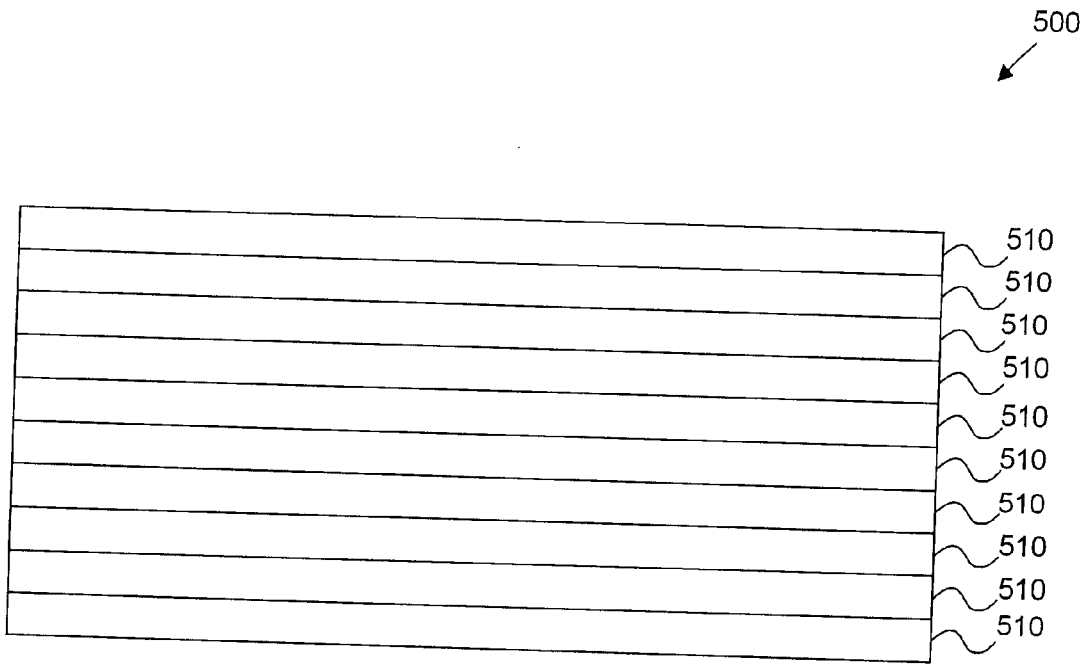

The in-situ oxidation process and in-situ oxidized films of the present invention may also be applied to other types of spin-valve sensors. As an additional example of a spin-valve sensor employing the deposition/in-situ oxidation method and resulting films of the present invention, a magnetic tunnel junction sensor is shown in FIG. 8. Referring to FIG. 8, shown therein is a magnetic-tunnel-junction sensor 800 comprising a pair of end regions 803, 805 separated by a central region 801. The central region 801 is formed by a suitable method such as sputtering onto a substrate 802 and has defined end regions that are contiguous with and abut the read gap layers 804.

Ferromagnetic sensing layers 807 are separated from ferromagnetic pinned layers 809 by 6 Å thick, in-situ oxidized Al (Al-O) barrier layer 812. Under one embodiment of the present invention, the sensing layers 807 comprise a 9 Å thick Co-Fe film 814 and an adjacent 27 Å thick Ni-Fe film 816. FIG. 8 also illustrates a layer of Ruthenium (Ru) 818, Cobalt-Iron (Co-Fe) 820, Iridium-Manganese (Ir-Mn) 822, and Ruthenium (Ru) 824. The pinned layers 809 comprise an 18 Å thick Co-Fe film 806, an 8 Å thick Ru film 808 and a 24 Å thick Co-Fe layer film 810. The magnetizations of the pinned layer 809 are fixed through exchange coupling with an a 200 Å thick antiferromagnetic Pt-Mn pinning layer 804.

In one embodiment of a manner of forming the magnetic-tunnel-junction sensor 800, a bottom shield layer 802, preferably formed of a 1 μm thick Ni-Fe film, and a seed layer 811, preferably formed of a 90 Å thick Ta film and a 10 Å thick Ni-Fe film are deposited on a substrate 801 of a wafer. An antiferromagnetic pinning layer 804, preferably formed of a 200 nm thick Pt-Mn film is deposited on the seed layer 811.

The pinned layers 809 are deposited on the pinning layer 804 and a barrier layer 812, preferably formed of an in-situ oxidized 6 Å thick Al (Al-O) film is deposited the pinned layers 809. The sensing layers 807 are deposited on the barrier layer 812. Longitudinal bias layers, preferably formed of a 30 Å thick Ru film, a 40 Å thick Co-Fe film, a 60 Å thick Ir-Mn film, a 90 Å thick Ru film, and a 30 Å thick Ta film are then deposited on the sensing layer. All the depositions are preferably conducted with DC magnetron sputtering.

After the depositions, the wafer is annealed for 5 hours at 265° C. in a magnetic field of 10 kOe perpendicular to an alignment mark, and then annealed again for 20 minutes at 240° C. in a magnetic field of 200 Oe parallel to the alignment mark. These two anneals cause the Pt-Mn film to pin the magnetizations of the Co-Fe/Ru/Co-Fe films in a direction perpendicular to the alignment mark, and cause the Ir-Mn film to pin the magnetization of its underlying Co-Fe film in a direction parallel to the alignment mark. After these two anneals, bilayer photoresists are applied and exposed in a photolithographic tool to mask the magnetic-tunnel-junction sensor in a read region, and then developed in a solvent to form an undercut.

Unmasked side regions of the magnetic-tunnel-junction sensor are removed by ion mill until the Al-O barrier layer is exposed. Subsequently, a plurality of layers 826 of in-situ oxidized thick Al (Al-O) are formed on the exposed Al-O film. In one embodiment, 22 layers are formed. The repeated deposition/in-situ oxidization process is identical to that described for FIG. 7. After this repeated deposition/in-situ oxidization process, the bilayer photoresist mask is lifted off and another patterning process is applied to the wafer for opening the central region. Ion milling or reactive ion etching is applied to remove the 3 nm thick Ta film and a top shield layer 825, preferably formed of a 1 μm thick Ni-Fe film, is deposited in the central region.

The thickness of the in-situ oxidized Al film used as a barrier layer of the magnetic-tunnel-junction sensor are optimized in order to attain a high tunnel magnetoresistance (TMR) coefficient and a low junction resistance. When a 5.4 Å thick Al film is deposited and is in-situ oxidized for 8 min in 0.5 Torr oxygen, a 6 Å thick Al-O film is formed and a tunneling effect is maximized, so that a TMR coefficient of as high as 20% and a junction resistance of as low as 8 $\Omega$-$\mu m^2$ are attained. This maximized tunneling effect occurs when the in-situ oxidization is optimal so that the entire Al film is oxidized without oxygen diffusion into the adjacent ferromagnetic film. When the in-situ oxidization is so mild that the Al film adjacent to the ferromagnetic film remains metallic, or so severe that oxygen diffuses into the adjacent ferromagnetic film, the tunneling effect has been found to not be insufficiently strong to attain a high TMR coefficient.

It should be noted that while the optimal in situ oxidation is needed for the use of the barrier layer of the magnetic-tunnel-junction sensor, a partial in-situ oxidation is needed for the use of the cap layer of the spin-valve sensor, and a full or severe in-situ oxidation is needed for the use of the gap layers of the spin-valve sensor and the magnetic-tunnel-junction sensor. Based on the previously described approach for maximizing the tunneling effects, it is speculated that the partial in-situ oxidation can be attained after deposition of a 8 Å thick Al film and in-situ oxidation for 8 min in 0.5 Torr oxygen, while the full in-situ oxidation can be attained after deposition of a 8 Å thick Al film and in-situ oxidation for 16 min in 2 Torr oxygen.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A spin-valve sensor comprising:
   an antiferromagnetic pinning layer;
   a pinned layer disposed to one side of the antiferromagnetic pinning layer;
   a sensing layer;
   a spacer layer disposed between the pinned layer and the sensing layer; and
   a cap layer disposed to one side of the sensing layer, the cap layer comprising a partially oxidized metal film wherein oxygen penetration into the sensing layer is substantially prevented.

2. The spin-valve sensor of claim 1, further comprising a seed layer disposed subjacent the antiferromagnetic pinning layer; the seed layer comprising an $Al_2O_3$ film, an Ni-Cr-Fe film and a Ni-Fe film; the antiferromagnetic pinning layer formed of a Pt-Mn film; the pinned layer formed of a Co-Fe film, an intervening Ru film, and a Co-Fe film; the spacer layer formed of an oxygen-doped, in-situ oxidized Cu film; the sensing layer formed of a Co-Fe film and a Ni-Fe film; and the cap layer formed of a partially in-situ oxidized metal film.

3. The spin-valve sensor of claim 2, wherein the partially oxidized metal film comprises Al and Al-O.

4. The spin-valve sensor of claim 1, wherein the partially oxidized metal film comprises Al and Al-O.

5. The spin-valve sensor of claim 1, wherein the partially oxidized metal film comprises an in-situ oxidized metal film.

6. The spin-valve sensor of claim 1, wherein the partially oxidized metal film comprises an in-situ oxidized, Al and Al-O film.

7. The spin-valve sensor of claim 1, wherein the partially oxidized metal film has a thickness in the range of between about 5 Å and about 15 Å.

8. The spin-valve sensor of claim 1, wherein the partially oxidized metal film has thickness a in the range of between about 8 Å and about 12 Å.

9. The spin-valve sensor of claim 1, wherein the partially oxidized metal film comprises Al with a thickness in a range of between about 1 Å and about 5 Å and Al-O with a thickness in a range of between about 5 Å and about 9 Å.

10. The spin-valve sensor of claim 1, further comprising an additionally partially oxidized metal film disposed between the cap layer and the sensing layer.

11. The spin-valve sensor of claim 10, wherein the additional partially oxidized metal film comprises an in-situ oxidized metal film selected from the group consisting of Au, Cu, Rh, or Ru film and has a thickness in the range of between about 8 Å and about 12 Å.

12. The spin-valve sensor of claim 1, further comprising a top gap layer disposed directly adjacent to the cap layer, and a bottom gap layer disposed to one side of the antiferromagnetic pinning layer.

13. The spin-valve sensor of claim 12, wherein at least one of the top gap layer and the bottom gap layer is formed of an in-situ oxidized metal film.

14. The spin-valve sensor of claim 12, wherein at least one of the top gap layer and the bottom gap layer is formed of a plurality of oxidized metal films.

15. The spin-valve sensor of claim 12, wherein the bottom gap layer and the top gap layer are each formed of a plurality of in-situ oxidized metal films.

16. The spin-valve sensor of claim 12, wherein the bottom gap layer and the top gap layer are each formed of a plurality of in-situ oxidized Al metal films.

17. A disk drive system comprising:
a magnetic recording disk;
a spin-valve sensor for reading data recorded on the recording disk, the spin-valve sensor comprising:
a substrate;
an antiferromagnetic layer (AFM) disposed to one side of the substrate;
a pinned layer formed of ferromagnetic material and positioned adjacent the antiferromagnetic layer, the magnetic orientation of the pinned layer substantially fixed by the antiferromagnetic layer, and the pinned layer comprising a layer of an electrically resistive material selected to reduce the amount of current traveling from the pinned layer to the antiferromagnetic layer;
a sensing layer of ferromagnetic material positioned adjacent the pinned layer, the sensing layer configured to have an electrical resistance that changes in response to changes in magnetic flux through the sensing layer; and
a cap layer disposed to one side of the sensing layer, the cap layer formed of a partially in-situ oxidized metal film having a thickness of in the range of between about 5 and about 15 Å, wherein oxygen penetration into the sensing layer is substantially prevented; and
an actuator for moving the spin valve sensor across the magnetic recording disk in order for the spin-valve sensor to access different magnetically recorded data on the magnetic recording disk; and
a detector electrically coupled to the spin-valve sensor and configured to detect changes in resistance of the sensor caused by rotation of the magnetization of the sensing layer relative to the fixed magnetizations of the pinned layer in response to changing magnetic fields induced by the magnetically recorded data.

18. A method of forming a spin-valve sensor, the method comprising:
forming an antiferromagnetic pinning layer;
forming a pinned layer to one side of the antiferromagnetic pinning layer;
forming a sensing layer;
forming a spacer layer disposed between the pinned layer and the sensing layer; and
forming a cap layer disposed to one side of the sensing layer by deposition and partial in-situ oxidation of a metal film, wherein oxygen penetration into the sensing layer is substantially prevented.

19. The method of claim 18, wherein deposition and in-situ oxidation of the metal film comprises depositing the metal film in a chamber substantially devoid of oxygen and transferring the film to an oxidation chamber in a vacuum and introducing oxygen to the metal film in the oxidation chamber in a controlled environment.

20. The method of claim 19, wherein depositing a metal film comprises depositing an Al film.

21. The method of claim 19, wherein deposition and in-situ oxidation of the metal film comprises DC magnetron sputtering and in-situ oxidation for a time in the range of between about 1 to about 100 minutes in oxygen gas with a pressure in the range of between about 0.1 to about 10 Torr.

22. The method of claim 19, wherein introducing oxygen comprises introducing oxygen with a pressure in the range of between about 0.4 and 0.6 Torr.

23. The method of claim 19, wherein introducing oxygen comprises introducing oxygen with a pressure in the range of between about 0.45 Torr and about 0.55 Torr.

24. The method of claim 19, wherein introducing oxygen comprises introducing oxygen with a pressure of about 0.5 Torr.

25. The method of claim 19, wherein introducing oxygen comprises introducing oxygen for a period in the range of between about 4 and about 12 minutes.

26. The method of claim 19, wherein introducing oxygen comprises introducing oxygen for a period in a range of between about 6 minutes and about 10 minutes.

27. The method of claim 19, wherein introducing oxygen comprises introducing oxygen for a period of about 8 minutes.

28. The method of claim 19, wherein introducing oxygen is conducted with a temperature of approximately ambient room temperature.

29. The method of claim 18, further comprising forming a protective gap layer.

30. The method of claim 29, wherein forming the protective gap layer comprises forming a plurality of oxidized metal layers.

31. The method of claim 30, wherein forming a plurality of oxidized metal layers comprises forming a plurality of in-situ oxidized aluminum layers, each having a thickness in the range of between about 5 and about 15 Å.

32. The method of claim 1, further comprising forming an additional partially in-situ oxidized metal film between the cap layer and the sensing layer.

33. The method of claim 32, wherein the additional partially in-situ oxidized metal film comprises Cu.

* * * * *

UNITED STATES PATENT AND TRADEMARK OFFICE
CERTIFICATE OF CORRECTION

PATENT NO. : 6,709,767 B2
DATED : March 23, 2004
INVENTOR(S) : Tsann Lin et al.

It is certified that error appears in the above-identified patent and that said Letters Patent is hereby corrected as shown below:

Drawings,
Figure 3, Layer 324 should read -- Gap --. (as shown on attached)
Figure 5, layers numbered 500 should read -- 510 --. (as shown on attached)

Column 2,
Line 20, "ARG" should read -- $\Delta R_G$ --.

Column 5,
Line 29, "disk Surface" should read -- disk surface --.

Column 6,
Line 6, "200 Å" should read -- 200 Å --.
Line 16, "n/m" should read -- nm --.
Line 57, "434" should read -- 324 --.

Column 8,
Lines 43 and 51, "504" should read -- 400 --.
Line 49, "to an the in-situ" should read -- to the in-situ --.
Lines 54 and 57, "704" should read -- 604-610 --.

Column 11,
Line 2, "$\lambda m_s$" should read -- $\lambda_s$ --.
Line 27, "substrate 802" should read -- 801a --.
Line 29, "gap layers 804" should read -- gap layers 824 --.

Column 13,
Line 24, "about 5 A" should read -- about 5 Å --.
Line 26, "has thickness a" should read -- has a thickness --.

Signed and Sealed this

Tenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,709,767 B2                              Page 1 of 1
DATED         : March 23, 2004
INVENTOR(S)   : Tsann Lin et al.

It is certified that error appears in the above-identified patent and that said Letters Patent is hereby corrected as shown below:

<u>Drawings,</u>
Figure 8, Substrate Layer numbered "801" should read -- 801a --.

Signed and Sealed this

Twenty-first Day of June, 2005

JON W. DUDAS
*Director of the United States Patent and Trademark Office*